United States Patent [19]

Rubin et al.

[11] Patent Number: 5,529,741
[45] Date of Patent: Jun. 25, 1996

[54] CONTROLLING THE COEFFICIENT OF THERMAL EXPANSION OF LIQUID CRYSTALLINE POLYMER BASED COMPONENTS

[75] Inventors: Leslie S. Rubin, Newton; Kent G. Blizard, Framingham, both of Mass.

[73] Assignee: Foster-Miller, Inc., Waltham, Mass.

[21] Appl. No.: 117,552

[22] Filed: Sep. 7, 1993

Related U.S. Application Data

[63] Continuation of Ser. No. 761,225, Sep. 17, 1991, abandoned.

[51] Int. Cl.$^6$ ............... B29C 47/00; B29C 55/26; B29C 71/04
[52] U.S. Cl. ............ 264/435; 264/209.2; 425/174.8 E; 425/382.3
[58] Field of Search ............... 264/22, 24, 108, 264/209.2, 290.2, 310, 312, 503, 435; 425/174.6, 174.8 R, 174.8 E, 382.3, 381

[56] References Cited

U.S. PATENT DOCUMENTS

| | | | |
|---|---|---|---|
| 4,384,016 | 5/1983 | Ide et al. | 428/1 |
| 4,624,872 | 11/1986 | Stuetz | 428/1 |
| 4,668,448 | 5/1987 | Weber et al. | 264/22 |
| 4,694,066 | 9/1987 | DeMartino et al. | 528/373 |
| 4,779,961 | 10/1988 | DeMartino | 350/350 R |
| 4,810,338 | 3/1989 | DeMartino et al. | 204/157.88 |
| 4,863,767 | 9/1989 | Garg et al. | 428/1 |
| 4,871,595 | 10/1989 | Lusignea | 428/1 |
| 4,882,402 | 11/1989 | Leslie et al. | 526/243 |
| 4,913,836 | 4/1990 | East | 252/299.01 |
| 4,915,491 | 4/1990 | DeMartino et al. | 350/330 |
| 4,933,112 | 6/1990 | DeMartino et al. | 252/587 |
| 4,939,235 | 7/1990 | Harvey et al. | 528/337 |
| 4,948,532 | 8/1990 | DeMartino et al. | 252/587 |
| 4,954,288 | 9/1990 | East | 252/299.01 |
| 4,957,655 | 9/1990 | Khanarian et al. | 252/299.01 |
| 4,963,428 | 10/1990 | Harvey et al. | 428/220 |
| 4,966,806 | 10/1990 | Lusignea et al. | 428/220 |
| 4,966,807 | 10/1990 | Harvey et al. | 428/220 |
| 4,973,442 | 11/1990 | Harvey et al. | 264/503 |
| 4,975,312 | 12/1990 | Lusignea et al. | 428/209 |
| 4,983,318 | 1/1991 | Matsumoto et al. | 252/299.01 |

FOREIGN PATENT DOCUMENTS

| | | | |
|---|---|---|---|
| 0293870 | 12/1988 | European Pat. Off. . | |
| 56-004434 | 1/1981 | Japan | 425/174.8 E |
| 63-173620 | 7/1988 | Japan | 425/381 |

Primary Examiner—Catherine Timm
Attorney, Agent, or Firm—David G. Conlin; Linda M. Buckley

[57] ABSTRACT

The present invention provides methods of preparing thermotropic and lyotropic liquid crystalline polymer film-based and tubular components having a controlled CTE and components produced by such methods. The methods of the present invention include treating a melt or dope of liquid crystalline polymer with simultaneous biaxial shearing forces and with an electric or magnetic field normal to each of the biaxial shearing forces.

8 Claims, 7 Drawing Sheets

CONTROLLING THE COEFFICIENT OF THERMAL EXPANSION OF LIQUID CRYSTALLINE POLYMER BASED COMPONENTS

STATEMENT OF GOVERNMENT SUPPORT

Funding for this invention was provided in part by the Government of the United States of America, through Contract No. NAS5-31404, by the National Aeronautics Space Administration. The Government has certain rights in this invention.

This is a continuation of application Ser. No. 07/761,225 filed on Sep. 17, 1991, abandoned.

FIELD OF THE INVENTION

The present invention is directed to methods of preparing film-based and tubular liquid crystalline polymer components having a controlled CTE and to components produced by such methods. The components have an in-plane controlled biaxial orientation skewed out of the plane of biaxial orientation.

BACKGROUND OF THE INVENTION

Rod-like, extended-chain, aromatic-heterocyclic polymers have received considerable interest in both academic and industrial laboratories over the past two decades. These polymers generally fall into two classes, those that are modified by temperature changes, i.e., thermotropic liquid crystalline polymers and those that are modified in solution form, i.e., lyotropic liquid crystalline polymers. These polymers are hereinafter sometimes referred to as thermotropic and lyotropic LCPs. For a short hand expression covering both types of polymers, the term "ordered polymers: will also sometimes be used herein.

As used herein, "ordered polymers," "extended-chain aromatic-heterocyclic ordered polymers," "thermotropic," and "lyotropic" liquid crystalline polymers (homopolymers, copolymers, and the like) all refer to one or more of the known classes of polymers having a fixed molecular orientation in space, i.e., linear, circular, star shaped, or the like. Such polymers are disclosed in the following patents:

U.S. Pat. No. 4,423,202 to Choe, discloses a process for the production of para-ordered, aromatic heterocyclic polymers having an average molecular weight in the range of from about 10,000 to 30,000.

U.S. Pat. No. 4,377,546 to Helminiak, discloses a process for the preparation of composite films prepared from para-ordered, rod-like, aromatic, heterocyclic polymers embedded in an amorphous heterocyclic system.

U.S. Pat. Nos. 4,323,493 and 4,321,357 to Keske et al., disclose melt prepared, ordered, linear, crystalline injection moldable polymers containing aliphatic, cycloaliphatic and araliphatic moieties.

U.S. Pat. No. 4,229,566 to Evers et al., describes para-ordered aromatic heterocyclic polymers characterized by the presence of diphenoxybenzene "swivel" sections in the polymer chain.

U.S. Pat. No. 4,207,407 to Helminiak et al. discloses composite films prepared from a para-ordered, rod-like aromatic heterocyclic polymer admixed with a flexible, coil-like amorphous heterocyclic polymer.

U.S. Pat. No. 4,051,108 to Helminiak et al., discloses a process for the preparation of films and coatings from para-ordered aromatic heterocyclic polymers.

Ordered polymer solutions in polyphosphoric acids (including PBZ compositions) useful as a dope in the production of polymeric fibers and films are described in U.S. Pat. Nos. 4,533,692, 4,533,693, and 4,533,724 (to Wolfe et al.).

The disclosures of each of the above described patents are incorporated herein by reference.

Thermotropic and lyotropic LCPs are of great interest, because they exhibit a partially ordered state that is intermediate between a three dimensional ordered crystalline state and the disordered or isotropic fluid state. As a consequence of the molecular ordering, LCPs are anisotropic (i.e., their properties are a function of molecular direction (R. A. Weiss and C. K. Ober, "Liquid-Crystalline Polymers," ACS Symposium Series 435, (1990)).

Structurally, most commercial LCPs consist of rigid mesogenic monomer units connected with either flexible spacers or "kink structures" to make them tractable and processable. The high degree of molecular order that can be achieved with the LCP molecules allows this material to attain a very tight packing density similar to a log jam in a river. LCPs derive their outstanding properties from this tightly packed rigid-rod formation which at a macroscopic level results in a structure that is self-reinforced through the strong interaction of electron deficient and electron rich benezene rings. However, the rigid-rod LCP molecule is highly anisotropic. The axial CTE of the LCP molecule is typically −5 to −10 ppm/°C. while the radial CTE is highly positive ($\approx$+70 ppm/°C.). This characteristic in the past has been one of the major reasons why LCP substrates have not been successfully used in electronic packaging applications.

Standard processing of the LCPs through slit dies typically results in a uniaxial film (all molecules aligned in one direction) with a highly negative CTE in the extrusion direction and a highly positive CTE in the transverse direction. This characteristic is undoubtedly unacceptable for, e.g., a chip-supporting substrate that will be exposed to thermal cycles. The resulting in-plane CTE mismatch between the substrate and the chip carrier will result in solder joint failures at the substrate/chip interface. In addition, uniaxial LCP films have virtually no transverse strength and uniaxial tubes have virtually no circumferential strength, and when placed under slight stresses can readily split in the fibril direction.

Novel LCP extrusion technologies disclosed, e.g., in U.S. Pat. Nos. 4,871,595; 4,939,235; 4,963,428; and 4,966,807; as well as in copending Ser. No. PCT/U.S. 90/03394, filed Jun. 18, 1990, (hereinafter referred to as "Extrusion Processes") enable the production of film-based and tubular components of thermotropic and lyotropic LCPs that have highly controlled biaxial orientation, resulting in films and tubes that have property balances that are much more useful from a practical standpoint than ordinary uniaxially referred to above are incorporated herein by reference. Films having a balanced biaxial orientation are particularly suitable for electronic packaging applications. Tubes with biaxial orientation are particularly suitable for structural applications. The biaxial orientation of such films and tubes are the result of a two stage orientation process, one of which occurs in a counter rotating-die, followed by post treatment to optimize the film property balance as disclosed in the Extrusion Processes.

Film-based and tubular components produced in accordance with the Extrusion Processes provide significant technological advances over standard LCP processing techniques by minimizing the problems associated with poor transverse and circumferential properties and providing techniques for tailoring various properties such as CTE, tensile strength and modulus (Blizard et al., *American Chemical Society Preprints*, Vol. 32, No. 2, 1991). This is accomplished by aligning the LCP molecules along two principal axes within a single ply.

The angle between the two principal axes on either side of, e.g., an LCP film, and the extrusion direction are normally balanced and identified by a ±θ nomenclature. The molecular orientation through the thickness of the film gradually changes from +θ to −θ. FIG. 1 illustrates the difference in molecular orientation between uniaxial oriented LCP film (FIG. 1A) and controlled biaxially oriented LCP film (FIG. 1B) produced in accordance with the Extrusion Processes. The arrows in FIGS. 1A and 1B indicate machine direction. FIGS. 2 and 3, scanning electron microscope (SEM) photographs of a thermotropic LCP film having controlled in-plane biaxial orientation and prepared in accordance with the Extrusion Processes which was frozen in liquid nitrogen and broken to reveal the internal fibrillar structure, also illustrate how the molecular orientation of the film gradually changes through its thickness. The lines indicate fibril orientation.

A combination of shearing and stretching during the counter-rotating dies used in the Extrusion Processes orients the LCP molecules/fibrils. A schematic of one such counter-rotating die is shown in FIG. 4. This schematic shows the following components of the counter-rotating die: drive 1, bearings 2, distribution block 3, outer rotor 4, inner rotor 5, film 6, outer and inner rotors 7, circumferential shear pattern 8, filter/strainer 9, and LCP from pump 10. The biaxial angle that the LCP fibrils make with the longitudinal axis of the tubular extrudate or film can be readily varied from ±5 to ±70 degrees. The rotation of the counter-rotating mandrels creates transverse shear flows that are superimposed on the axial shear developed as the polymer melt is extruded through the die. This operation presets the biaxial orientation. Subsequent post-die draw and blow, as shown in the counter-rotating die extrusion process schematic presented in FIG. 5, is used to further adjust and enhance the biaxial orientation. FIG. 5 shows the following components: desiccant/drier heater 20, hot dry air in 21, metering auger 22, gear pump 23, 200 mesh coarse filter 24, one inch extruder 24:1 L/d, 6:1 compression ratio 25, counter-rotating die 26, blow up ratio 27, draw rate 28, blown film 29, convergence rollers 30, and pinch rollers 31.

When LCPs are processed into balanced biaxial films, i.e., about ±45 degrees, physical properties such as CTE, tensile strength and modulus are about equal in any in-plane direction. This control of CTE through control of molecular orientation is graphically illustrated in FIG. 6 where the machine (extrusion) direction and transverse direction CTEs for 3 mil thick balanced biaxial film of a particular thermotropic LCP are plotted as a function of biaxial orientation. As the biaxial orientation approaches ±45 degrees the machine and transverse CTEs converge to +3 to +4 ppm/°C. Other LCPs processed into ±45 degree biaxial films have yielded CTEs ranging from −10 to +4 ppm/°C.

Electronic packaging has undergone major technical advances since the 1970s due to the development of large scale integrated chip technology (LSI), very large scale integrated chip technology (VLSI), and very high speed integrated circuit technology (VHSIC). The introduction of hermetic leadless ceramic chip carriers (LCCCs) as a replacement for bulky dual in-line packages (DIPs) and the development of surface mount technology processes have also heightened the need for advanced interconnection substrate materials. Traditional printed wire board (PWB) materials such as fiber reinforced epoxies and polyimides, and alumina-beryllia ceramic cannot take full advantage of the increased input/output (I/O) density, improved reliability and lower cost offered by today's advanced electronic packaging technologies.

For example, the use of LCCGs in surface mount technology applications results in a coefficient of thermal expansion (CTE) mismatch between the ceramic carriers (CTE= 6.4 ppm/°C.) and the epoxy-glass or polyimide-glass PWB substrate (11 to 16 ppm/°C.). Large multichip modules (MCMs) with a CTE of 3 to 7 ppm/°C. also have a similar substrate/module CTE mismatch problem. This mismatch in thermal expansion reduces the surface mount component solder joint reliability, especially in applications with frequent or extreme temperature cycles. This failure mechanism is a critical concern, especially in military and space applications where improper operation can have disastrous effects or can result in defects in expensive systems which cannot be repaired.

A variety of techniques are presently used to resolve the PWB/LCCC CTE mismatch problem. Each of these approaches, however, has certain drawbacks. For example, ceramic substrates have the required CTE, but are very brittle and expensive. Their vulnerability to chipping and cracking reduces their reliability. They are also difficult and costly to repair. Furthermore, their high dielectric constant (9.4) also restricts their use in high density VHSIC applications.

New fiber-reinforced composites using Kevlar, graphite or quartz fiber are also being developed to match the LCCC CTE, but these materials also have drawbacks (See, e.g., Belke Jr., et al. *Tailorable Coefficient of Thermal Expansion Multilayer PWBs for High Density Leadless Perimeter and Grid Array Packages*, Final Report, AFWAL-TR-87-4152, prepared for Materials Lab, Wright Patterson AFB, March 1988.). The thickness of the fiber weave is at least twice the diameter of the fiber. State of the art fabric weave thickness is limited to approximately 0.005 in. Add the thickness of the resin and it becomes difficult to produce thin layer composites. The surface finish is also likely to be affected by the anisotropic weave geometry in very thin sections. Differential thermal expansion between the fiber and matrix promotes microcracking. The discontinuous nature of the weave can also cause nonuniform expansion. The use of papers, matrix and platelets may reduce these problems, but still produce a multicomponent reinforced material rather than a homogeneous substrate (See, e.g., J. Diekman and M. E. Mirhej, *Non-Woven Aramid Papers—A New PWB Reinforcement Technology*, IEPS Proceedings, Marlborough, Mass, Sept. 1990.). High dielectric constant and costly manufacturing are additional problems associated with these new composites.

Matched CTE substrates may also be made by using high stiffness metal core layers with very low CTE (See, e.g., R. C. Daigle et al., *Engineering Printed Wire Boards for Enhanced Surface Mount Reliability*, IEPS Proceedings, Marlborough, Mass, Sept. 1990.). These internal metal planes constrain the overall PWB expansion. The most commonly used core material is copper-clad invar (Cu-In-Cu), followed by copper-clad molybdenum and Alloy 42. These metal cores, however, are relatively heavy and require surface and via insulation to prevent circuit shorts.

Recently, more advanced substrates using fluorocarbon based materials have been introduced, particularly for military electronics packaging. These fluorocarbon substrates have an in-plane CTE which matches the metallization CTE, have a low dielectric constant and can be fabricated into relatively thin substrates. These materials, however, are difficult to process, require special processing equipment and because they are compliant, have a low modulus which can lead to vibration induced failures.

Clearly, there is a need for an improved electronic substrate that can improve PWB reliability. Ideally this substrate should have a self-reinforcing structure, low dielectric constant (<3.0), low dissipation factor (<0.05), low moisture absorption (<0.5%), in-plane (x-y plane) CTE of 6 to 7 ppm/°C. for LCCCs and 3 to 7 ppm/°C. for multichip modules, a medium level modulus (0.3 to 1.5 MSI) and be readily fabricated into thin substrates (<2.0 mil).

Thermotropic and lyotropic LCPs are well-suited for advanced PWBs because they possess a low dielectric constant, about 2.8 and 2.6 respectively, and can be fabricated into very thin substrates, 1 to 2 mil and 0.1 to 0.2 mil respectively. These LCPs also have low moisture absorption (<0.1 percent) and excellent barrier properties. Furthermore, thermotropic LCPs have medium level modulus (1.0 MSI) and can be fabricated into MLBs using standard MLB equipment and techniques with minimal retooling.

Improved electronic substrates comprising biaxially oriented thermotropic and lyotropic liquid crystalline polymers having a controlled CTE are disclosed in U.S. Pat. Nos. 4,975,312 and 4,871,595 respectively. However, the in-plane CTE of an as extruded balanced biaxial component is highly dependent on the LCP composition. Accordingly, in some instances it is desirable to further tailor the CTE of such biaxially oriented components, and methods to accomplish this objective are being sought.

SUMMARY OF THE INVENTION

The present invention provides methods to further control the CTE of thermotropic and lyotropic LCP film-based and tubular components having a controlled in-plane biaxial orientation and components produced by such methods. When the term "in-plane orientation" is used with respect to tubular components, the orientation referred to is the orientation at a constant radial distance from the center-line, constrained by the inner and outer tube surfaces.

It has been discovered that the in-plane CTE of controlled biaxially oriented LCP articles of manufacture, such film-based and tubular components, can be further controlled through the use of electric or magnetic fields. For example, for electronic substrate applications, the CTE of a thermotropic or lyotropic LCP film having controlled in-plane biaxial orientation, preferably balanced biaxial, can be further controlled to essentially match the CTE of LCCCs and MCMs, and, thus, eliminate or significantly reduce the solder joint failure problem caused by thermal cycling.

One preferred method of the present invention for preparing film-based or tubular components having a controlled CTE and comprising an aromatic thermotropic or lyotropic liquid crystalline polymer film or tube having a controlled in-plane biaxial orientation skewed out of the plane of orientation comprises the sequential steps of:

(a) treating a melt comprising the aromatic thermotropic liquid cystalline polymer or a dope comprising the lyotropic liquid crystalline polymer with simultaneous biaxial shearing forces, thereby producing a film or tube having a controlled in-plane biaxial orientation;

(b) treating the film or tube obtained in step (a) with cross-directional strains comprising transverse and longitudinal extensions thereby imparting additional controlled in-plane biaxial orientation; and (c) subjecting the film or tube obtained in step (b) to an electric or magnetic field that is normal to the in-plane orientation thereby producing a film wherein the controlled biaxial orientation is skewed out of the plane of orientation.

Yet another preferred method in accordance with the present invention of preparing a film-based or tubular component having a controlled CTE and comprising an aromatic thermotropic or lyotropic liquid crystalline polymer film or tube having a controlled in-plane biaxial orientation skewed out of the plane of orientation, comprises the steps of:

(a) simultaneously treating a melt comprising the aromatic thermotropic liquid crystalline polymer or a dope comprising the lyotropic liquid crystalline polymer with (i) simultaneous biaxial shearing forces and (ii) an electric or magnetic field that is normal to each of the biaxial shearing forces, thereby producing a film or tube having at least three microscale structual orientations; and (b) treating the film or tube obtained in step (a) with cross-directional strains comprising transverse and longitudianl extensions thereby imparting additional microscale structural organization to the film or tube.

When the liquid crystalline polymer is lyotropic, the latter method may further comprise a step between steps (b) and (c) wherein the film or tube is partially coagulated. This alternative step is useful when it is desired to further strengthen the film or tube.

Typically, the film-based and tubular components produced by the methods of the present invention are solidified or coagulated to retain the controlled orientation imparted thereto.

In accordance with the methods of the present invention, the controlled biaxial orientaiton is skewed to about 2 to 88 degress of normal to the plane of biaxial orientation. The degree of skewing imparted is sufficient to achieve the desired CTE and will vary depending upon the particular LCP polymer, as well as the desired CTE.

Film-based and tubular thermotropic and lyotropic liquid crystalline polymer components having a CTE of about −10 to 64 ppm/°C. may be prepared in accordance with the methods of the present invention.

The controlled in-plane biaxial orientation of thermotropic and lyotropic LCP polymers for use in the present invention may be imparted by any suitable method, i.e., a method that provides the necessary control over the biaxial orientation achieved. The degree of control over in-plane biaxial orientation as is imparted by the Extrusion Processes is preferred.

The present invention provides film-based and tubular components having a controlled CTE, wherein the components comprise aromatic thermotropic or lyotropic liquid crystalline polymer films or tubes having a controlled in-plane biaxial orientation skewed out of the plane of biaxial orientation.

The controlled in-plane biaxial orientation of such components is preferably skewed from about 2 to about 88 degrees of normal to the plane of biaxial orientation. Such components have a resultant in-plane CTE of about −10 to 64 ppm/°C. For certain electronic substrate applications the in-plane CTE is preferably about 3 to 7 ppm/°C.

Preferred thermotropic liquid crystalline polymers for use in the present invention include wholly aromatic copolyesters based on terephthalic acid, p,p'-dihydroxybiphenyl, and p-hydroxybenzoic acid, or primarily aromatic copolyesters based on p-hydroxybenzoic acid and hydroxynapthoic acid. Particularly preferred aromatic thermotropic liquid crystalline polymer include XYDAR® and VECTRA.® Components comprising such LCPs and having an in-plane CTE of about 2 to 17 ppm/°C. are readily prepared in accordance with the teachings of the present invention.

Lyotropic liquid crystalline polymers for use in the present invention include para-ordered, aromatic heterocylic polymers; ordered, linear, crystalline polymers containing aliphatic, cycloaliphatic and aralaliphatic moieties; para-ordered aromatic heterocyclic polymers having diphenoxybenzene swivel sections in the polymer chain; para-ordered aromatic heterocyclic polymers containing phyenyl groups along the polymer chain backbone; and p-phenylenebenzo bisthiazole. Preferred lyotropic liquid crystalline polymers include PBZ polymers. Particularly preferred PBZ polymers are PBO, PBT, and PBI, and random, sequential or block copolymers thereof.

DETAILED DESCRIPTION OF THE INVENTION

Figures 1A, 1B:
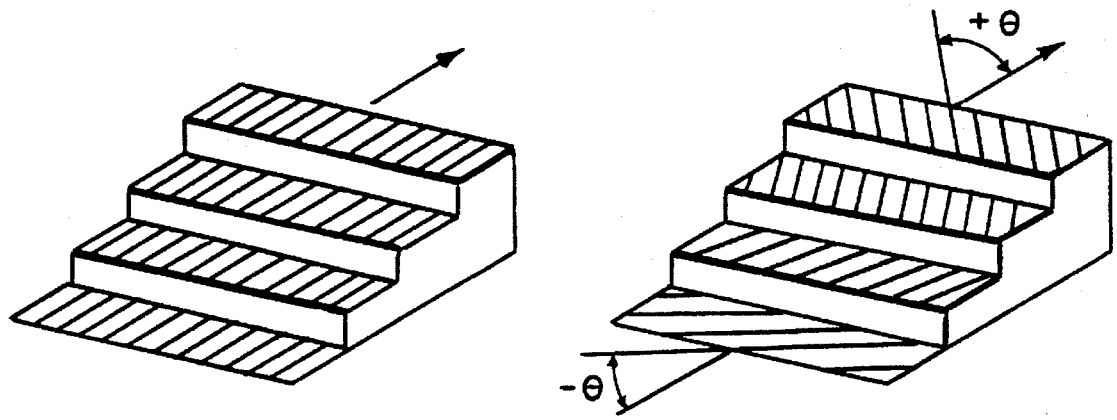
FIG. 1A and 1B are schematics showing the morphology of a single layer oriented LCP film.
Figure 4:
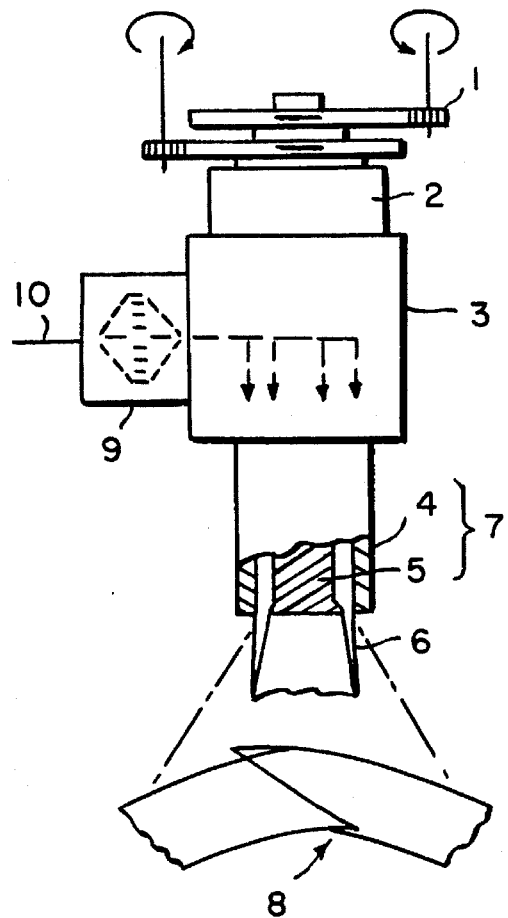
FIG. 4 is a schematic diagram of one counter-rotating die for use in the present invention.
Figure 2:
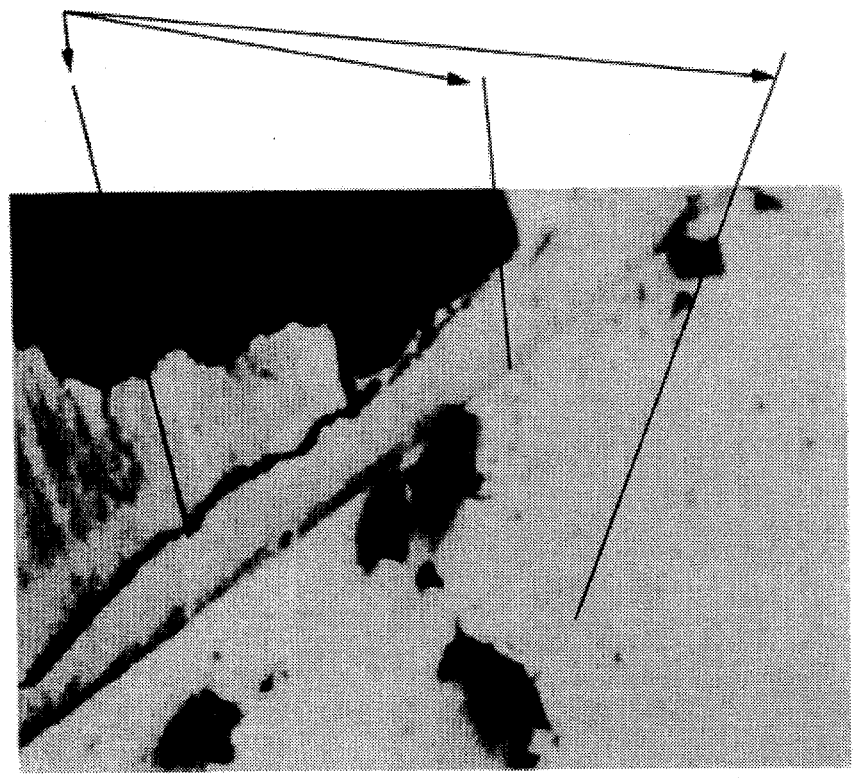
FIG. 2 is a scanning electron microscope (SEM) photograph of a thermotropic LCP film having controlled in-plane biaxial orientation.
Figure 3:
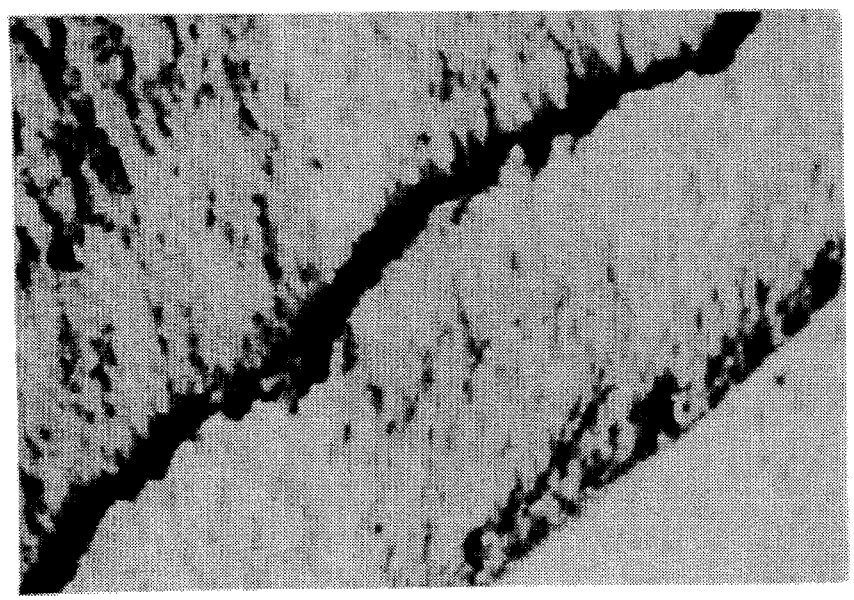
FIG. 3 is a further magnification of the SEM shown in FIG. 2.

The present invention is directed to methods of preparing film-based and tubular components having a controlled CTE, the components comprising aromatic thermotropic or lyotropic liquid crystalline polymer films or tubes having an in-plane controlled biaxial orientation skewed out of the plane of biaxial orientation, i.e., in the z-direction, and to components produced by such methods.

The in-plane CTE of film-based and tubular components fabricated from biaxially oriented LCPs is highly dependent on LCP composition. This CTE, however, can be modified, in accordance with the teachings of the present invention, either during or after biaxial orientation of the LCP, to further control the CTE by skewing the in-plane biaxial oriented LCP molecules out of the plane of orientation, i.e., in the z-direction.

The controlled in-plane biaxial orientation of thermotropic or lyotropic LCPs for use in the present invention may be imparted by any method which provides the necessary control to achieve the desired orientation, e.g., the Extrusion Processes. Likewise, the orientation into the z-direction may be achieved by any method which enables the necessary control, e.g., a magnetic or an electric field.

In one preferred embodiment of the present invention, the controlled in-plane biaxial orientation of thermotropic or lyotropic LCP film-based or tubular components is achieved through the use of the Extrusion Processes, and the orientation into the z-direction is achieved by the application of an electric or magnetic field.

In accordance with the Extrusion Processes the in-plane orientation can be varied from about ±5 to ±80 degrees. In components where in-plane isotropy is desired, e.g., electronic substrates, a balanced biaxial orientation of about ±45 degrees is preferred. Steps to skew the controlled in-plane biaxial orientation of such thermotropic or lyotropic LCP molecules into the z-direction may be carried out at the same time as are the steps to achieve controlled in-plane biaxial orientation of the LCP molecules.

In one preferred embodiment of the present invention, the controlled in-plane biaxial orientation of an aromatic thermotropic or lyotropic LCP film-based or tubular component is "reoriented" into the z-direction, i.e., the film-based or tubular component is first provided with controlled in-plane biaxial orientation which is then skewed into the z-direction by application of an electric of a magnetic field. One such method comprises the sequential steps of:

(a) treating a melt comprising the aromatic thermotropic LCP or a dope comprising the lyotropic LCP with simultaneous biaxial molecular shearing forces, thereby producing a film or tube having a controlled in-plane biaxial orientation;

(b) treating the film or tube obtained in step (a) with cross-directional strains comprising transverse and longitudinal extensions thereby imparting additional controlled in-plane biaxial orientation; and (c) subjecting the film or tube obtained in step (b) to an electric or a magnetic field that is normal to the plane of biaxial orientation thereby producing a film wherein the controlled biaxial orientation is skewed out of the plane of biaxial orientation.

In such methods where the controlled in-plane biaxial orientation is "re-oriented," the method may further comprise a step between steps (b) and (c) wherein the film or tube is paritially coagulated, particularly where it is desired to strengthen a component before application of the electric or magnetic field. This additional step is expected to be especially useful for producing lyotropic LCP components.

In some applications wherein the controlled in-plane biaxial orientation of a lyotropic LCP component is re-oriented in accordance with the present invention, it is preferred to put the LCP component in a gel or partially coagulated state that has sufficient strength to support handling, yet is tractable to accomodate molecular re-orientation. This gel state may be achieved, e.g., by placing the LCP extrudate into an acid bath, the bath having a reduced acid concentration over the carrier solvent used to produce the lyotropic LCP dope. The desired acid concentration to achieve the desired gel state for a particular lyotropic LP can be readily determined by one of ordinary skill in the art. In the case of reorienting the controlled biaxial orientation of lyotropic LCP tubes which are in a gel or partially coagulated state, the process is carried out under conditions to prevent further coagulation, e.g., under an inert atmosphere.

The controlled in-plane biaxial orientation of a partially coagulated LCP may be readily skewed from about 2 to 88 degrees of normal to the plane of biaxial orientation.

After the desired CTE has been achieved the lyotropic component will typically be coagulated and the thermotropic LCP solidified to retain the CTE imparted thereto through the controlled orientation.

To reorient the controlled in-plane biaxial orientation of thermotropic liquid crystal polymer tubes, a conductive rod such as one constructed from metal, is placed through the center of the biaxially oriented LCP tube and maintained concentric to the tube wall. Clearance from the tube inner diameter to the rod outer diameter is kept to less than 0.02 inches, i.e., 20 mil. However, closer clearances are preferred. Simultaneously, a hollow conductive metal tube is placed over the LCP tube and also held concentric to the tube wall. Again, clearances are held to less than about 20 mil and closer clearances are preferred. DC voltage is placed across the conductive tube and conductive rod, producing an electric field normal to the tube wall. The DC voltage is applied while the LCP is a melt state. Melt temperature is defined as that temperature which is 5 to 10 degrees Celsius higher than the onset of melt as determined by DSC anaylysis.

In yet another preferred embodiment of the present invention, the electric or magnetic field is applied to a melt of a thermotropic LCP or a dope of a lyotropic LCP as simultaneous biaxial shearing forces are applied thereto, e.g., in accordance with the Extrusion Processes, to produce a component having controlled in-plane biaxial orientation, skewed out of the plane of orientation. One such method comprises the steps of:

(a) simultaneously treating a melt comprising the aromatic thermotropic LCP or a dope comprising the LCP with (i) simultaneous biaxial shearing forces and (ii) an electric or magnetic field that is normal to each of the biaxial shearing forces, thereby producing a film or tube having at least three microscale structural orientations, i.e., a contolled in-plane biaxial orientation skewed out of the plane of biaxial orientation; and (b) treating the film or tube obtained in step (a) with cross-directional strains comprising transverse and longitudinal extensions thereby imparting additional microscale structural organization to the film or tube.

In one such embodiment where the thermotropic or lyotropic LCP film or tube is produced in accordance with the Extrusion Processes, a positive voltage is applied to the inner rotating mandrel of the counter rotating die through the use of a slip ring placed above the supporting bearings. A negative voltage is applied to the other rotating mandrel of the counter-rotating die, also with slip rings above the supporting bearing. A DC voltage is placed across the rotating mandrels to produce a field that is normal to the LCP melt or dope within the die. A combination of rotational shear, longitudinal shear, and electric field produce a thermotropic or lyotropic LCP component having a controlled in-plane biaxial orientation, wherein the biaxially oriented LCP molecules are skewed into the Z-direction or through the thickness of the LCP component.

The CTE of a thermotropic or lyotropic liquid crystalline polymer film having a controlled in-plane biaxial orientation, can also be further controlled in accordance with the teachings, of the present invention. Such methods comprise the application of an electric or a magnetic field normal to the plane of orientation thereby skewing the controlled biaxial orientation out of the plane of orientation, e.g., to about 2 to 88 degrees of normal to the plane of the film.

In the case of thermotropic components having a controlled in-plane biaxial orientation, the electric or magnetic field may be applied to the component before it is solidified to retain the controlled biaxial orientation. Alternatively, the electric or magnetic field may be applied to the component after it has been solidified to retain the controlled biaxial orientation. In such cases, the thermotropic component is heated to a temperature which allows sufficient movement of the thermotropic LCP molecules to reorient in response to the electric or magnetic field. The preferred temperature for reorientation into the z-direction is dependent upon the particular thermotropic LCP, e.g., about 5 to 10 degrees C. beyond the onset of melt as determined by Differntial Scanning Calorimeter (DSC) analysis.

In the case of lyotropic components having a controlled in-plane biaxial orientation, the electric or magnetic field is preferably applied to the component before it is coagulated. However, for some applications the electric or magnetic field may be applied to the component after it has been partially coagulated to impart greater cohesive strength through the thickness of the component. The extent of coagulation is such that there is sufficient movement of the lyotropic LCP molecules to reorient in response to the electric or magnetic field.

The strength of the electric or magnetic field, as well as the duration of its application to reorient the controlled biaxially oriented LCP molecules is dependent upon the characteristics of the particular LCP, e.g., viscosity, molecular weight and rigidity. For example, for higher viscosity, high molecular weight or increased rigidity, higher fields would typically be required.

The degree of controlled in-plane biaxial orientation will depend, e.g., upon the direction in which it is desired to tailor the CTE. For example, as has been discussed above for by electronic substrates, at the present time, it is desired that the in-plane biaxial orientation be balanced biaxial to achieve in-plane isotropy. However, for a tubular structure, e.g., used as a truss, it is desirable to have the tube display a certain CTE in the axial or long direction to minimize stress at joints where the tube ends.

Accordingly, as it can be seen that the degree of control of biaxial orientation and the skewing of this controlled molecular orientation into the z-direction will depend upon the particular CTE desired.

Thermotropic and lyotropics LCPs as described below are generally useful in the practice of the present invention.

Two especially preferred thermotropic liquid crystalline polymers from which the films and tubes of the present invention can be prepared are XYDAR® LCP polymers from Amoco Performance Products, Inc., and VECTRA® LCP polymers from Hoechst-Celanese.

The structures of these two polymers are:

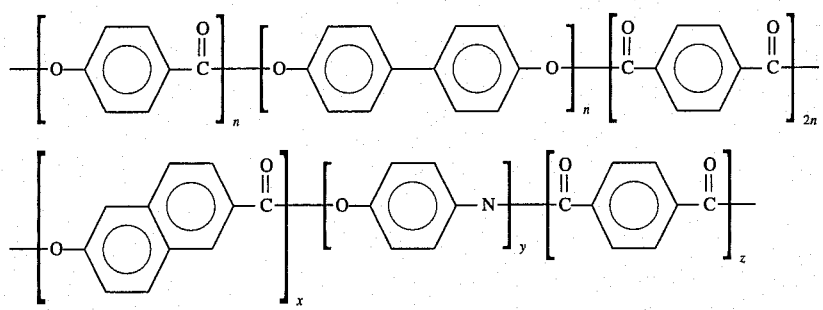

Xydar

Vectra

Polybenzazole (PBZ) polymers are preferred lyotropic liquid crystal polymers for use in the present invention. Preferred PBZ polymers are selected from the group consisting of polybenzoxazole (PBO), polybenzothtazole (PBT or PBZT) and polybenzimidazole (PBI) polymers, and random, sequential or block copolymers thereof. Polybenzazole polymers and their synthesis are described at length in numberous references, such as Wolfe, *Liquid Crystalline Polymer Compositions, Process and Products,* U.S. Pat. No. 4,533,693 (Aug. 6, 1985) and W. W. Adams et al., *The Material Science and Engineering of Rigid-Rod Polymers* (Materials Research Society 1989), which are incorporated herein by reference.

PBZ polymers preferably contain a plurality of mer units that are AB-PBZ mer units, as represented in Formula 1(a), and/or AA/BB-PBZ mer units, as represented in Formula 1(b)

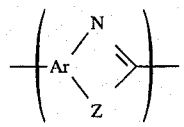  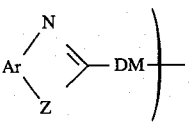

1(a) AB-PBZ    1(b) AA/BB-PBZ wherein:

Each Ar represents an aromatic group. The aromatic group may be heterocyclic, such as a pyridinylene group, but it is preferably carbocyclic. The aromatic group may be a fused or unfused polycyclic system. The aromatic group preferably contains no more than about three six-membered rings, more preferably contains no more than about two six-membered rings and most preferably consists essentially of a single six-membered ring. Examples of suitable aromatic groups include phenylene moleties, biphenylene moleties and bisphenylene ether moleties. Each Ar is most preferably a 1,2,4,5-phenylene moiety.

Each Z is independently an oxygen atom, a sulfur atom or a nitrogen atom bonded to an alkyl group or a hydrogen atom. Each Z is preferably oxygen or sulfur (the polymer is preferably PBO, PBT or a copolymer thereof);

Each DM is independently a bond or a divalent organic moiety that does not interfere with the synthesis, fabrication or use of the polymer. The divalent organic moiety may contain an aliphatic group (preferably $C_1$ to $C_{12}$), but the divalent organic moiety is preferably an aromatic group (At) as previously described. Each DM is preferably a 1,4-phenylene moiety or a 4,4'-biphenylene moiety, and is most preferably a 1,4-phenylene moiety.

The nitrogen atom and the Z moiety in each azole ring are bonded to adjacent carbon atoms in the aromatic group, such that a five-membered azole ring fused with the aromatic group is formed.

The azole rings in AA/BB-PBZ mer units may be in cis- or trans-position with respect to each other, as illustrated in 11 *Ency. Poly. Sci. & .Eng.,* 601, at 602, (J. Wiley & Sons 1988) which is incorporated herein by reference.

The PBZ polymer may be rigid rod, semirigid rod or flexible coil. It is preferably rigid rod in the case of an AA/BB-PBZ polymer or semirigid in the case of an AB-PBZ polymer. It more preferably consists essentially of AA/BB-PBZ mer units. Exemplary highly preferred mer units are illustrated in Formulas 2(a)–(e).

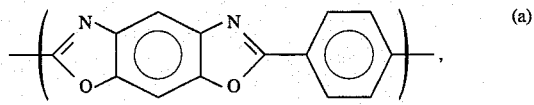 (a)

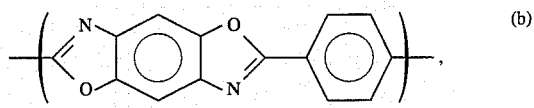 (b)

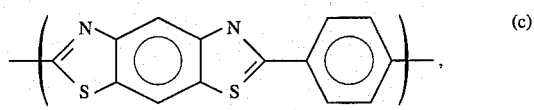 (c)

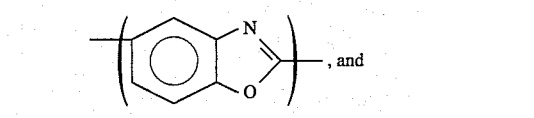 , and

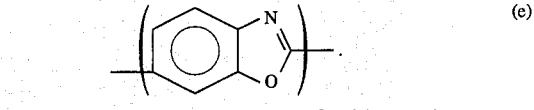 (e)

The polybenzazole polymer most preferably consists essentially either of the mer units illustrated Formula 2(a) (cis-PBO) or of the met units illustrated in Formula 2(c) (trans-PBZT).

Each polymer preferably contains on average at least about 25 mer units, more preferably at least about 50 mer units and most preferably at least about 100 mer units. The intrinsic viscosity of cis-PBO or trans-PBZT in methanesulfonic acid at 25° C. is preferably at least about 10 dL/g, more preferably at least about 20 dL/g and most preferably at least about 30 dL/g. wherein each X is independently selected from the group consisting of sulfur and oxygen; and each Y is nitrogen.

An especially preferred PBX compound is PBO, which has the following structure.

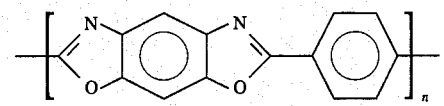

When ordered polymers such as XYDAR,® VECTRA,® PBT, PBI, and PBO and/or are subjected to a shear force they become highly aligned in the direction of the applied force. By imparting to such polymers more than one such force, in-plane properties that are more balanced than those obtained with a single directional force are attained.

Figure 7:
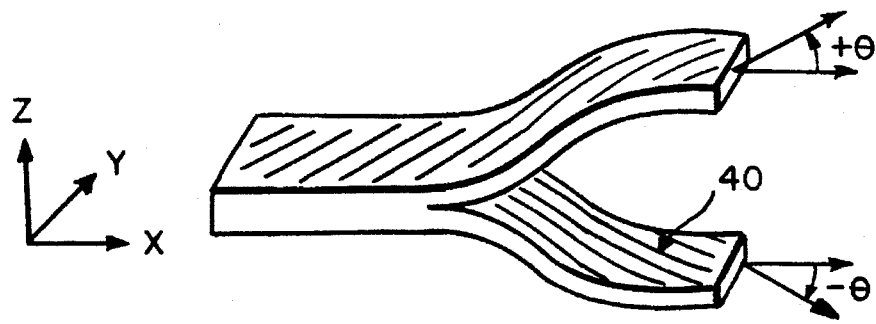
FIG. 7 is an exploded view of a biaxially oriented film produced by a counter-rotating annular die.
Figure 8:
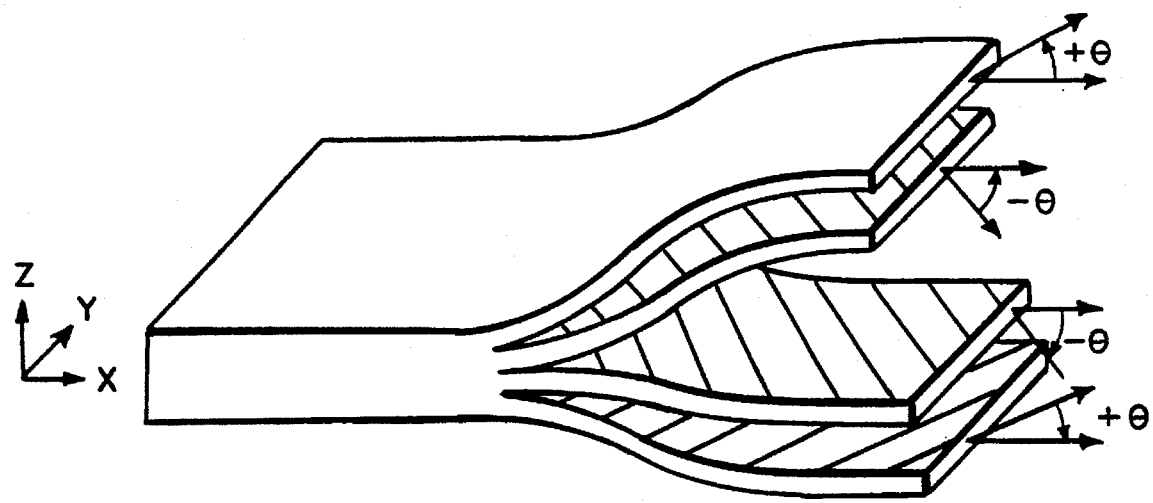
FIG. 8 is an exploded view of a biaxially oriented film produced in accordance with the extrusion processes by use of a tri-axial die.

In some of the Extrusion Processes a counter-rotating annular die was used to extrude VECTRA® film having a controlled in-plane balanced biaxial molecular orientation. Although this film had balanced in-plane properties (equal values in any polar direction), it was found that it had a tendency to curl because of its lack of symmetry through the film thickness as shown in FIG. 7. In FIG. 7 the arrows indicate machine direction. The direction of microfibrillar orientation in uniply is shown at 40. To reduce this curling a Tri-Axial Die has been used that produces biaxial film that has through the thickness symmetry in a single extrusion process. This symmetric structure (+θ, −θ, −θ, +θ) is illustrated in FIG. 8. This process produces non-curling LCPs film for use as the electrical substrates.

This invention will be illustrated primarily through film-based substrates for electrical packaging applications which comprise thermotropic LCP films having a controlled in-plane biaxial molecular orientation skewed out of the plane of orientation. However, the practice of this invention also applies to control of CTE for other applications, as well as, to other articles of manufacture, e.g., tubes and tubular structures.

Figures 9A, 9B:
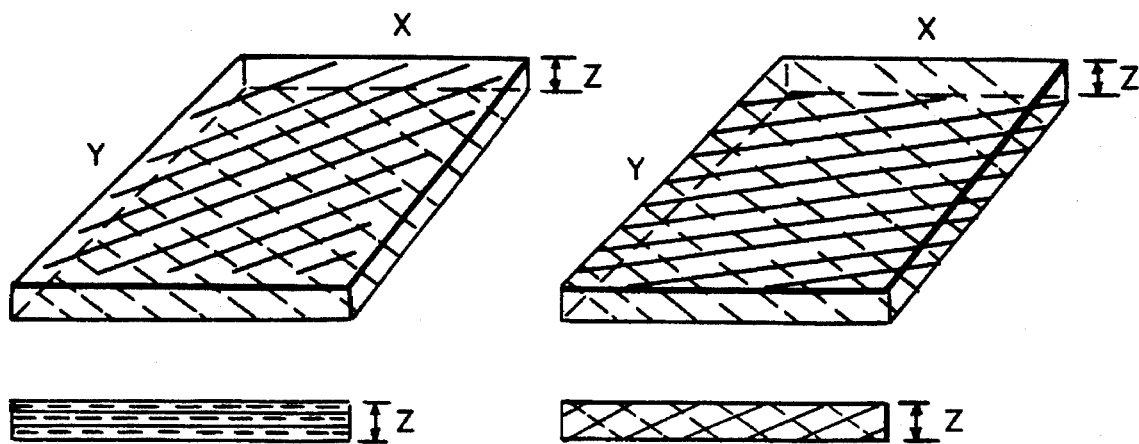
FIG. 9A is a schematic representation of a biaxially oriented LCP film wherein the LCP molecules are parallel to the x-y plane.
FIG. 9B is a schematic representation of an LCP film having controlled in-plane biaxial molecular orientation which is skewed into the z-direction.

Thermotropic LCP molecules in biaxial oriented films extruded in accordance with the Extrusion Processes lie relatively parallel to the surface of the film as shown in FIG. 9a.

When films are heated to just above their melting temperature and exposed, in accordance with the teachings of the present invention, to an electric or a magnetic field that is normal to the film's surface, the aromatic and polar LCP molecules are skewed out of the plane of orientation, i.e., into the z-direction, as shown in FIG. 9b. By skewing the molecules into the z-direction, a portion of the LCP molecule's radial CTE, in most instances highly positive, is transposed into the x-y plane. A balanced biaxially oriented film (about ±45 degrees) with a negative or slightly positive in-plane CTE can thereby be readily modified to produce a less negative or more positive in-plane CTE. This process can be used, e.g., to tailor the CTE of an about balanced biaxially oriented film comprising VECTRA® A900 to +6 to +7 ppm/°C. for use with LCCCs. Other more negative LCPs can be similarly processed to provide the desired CTE.

Figure 10:
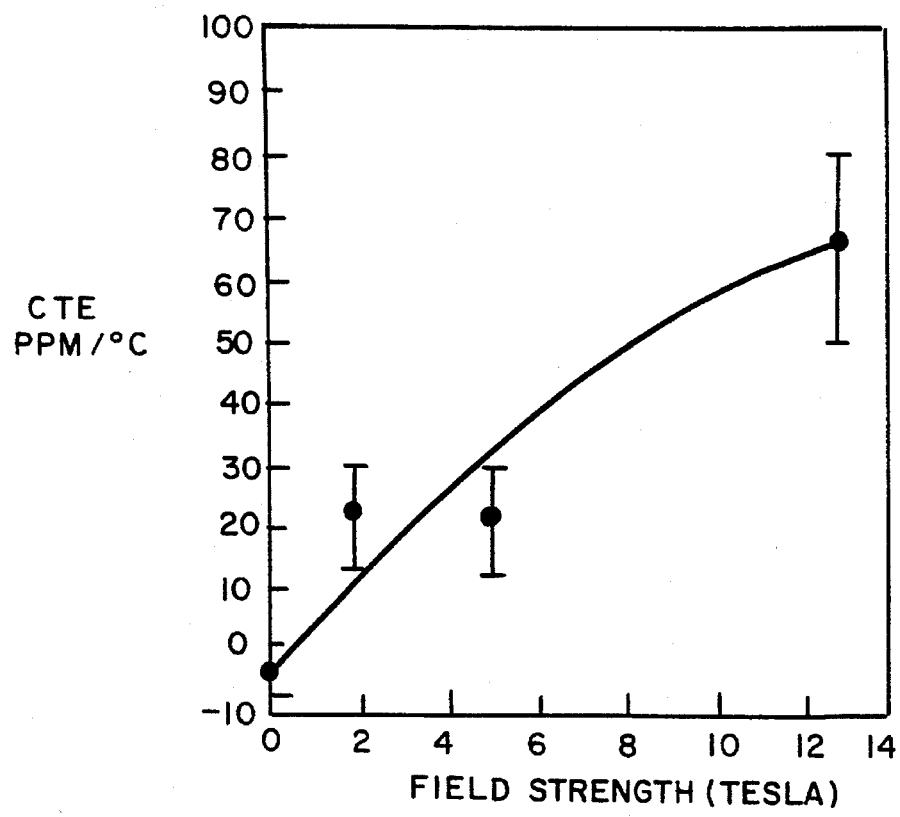
FIG. 10 is a graph showing the reorientation of thermotropic LCP film having controlled in-plane biaxial orientation skewed into the z-direction through the use of a magnetic field.

In one preferred embodiment of the present invention, the molecular z-direction skewing of biaxially oriented thermotropic LCP components, e.g., films, is achieved by the application of a magnetic field. In one set of experiments, samples of 2 mils thick, balanced biaxially oriented (about ±45 degrees) LCP film comprising VECTRA® A900 were subjected to a range of magnetic fields. The films were heated to 290° C. and exposed to a magnetic field normal to the film's surface for varying times ranging from 15 min. to one hour. The results of these experiments for a 15 min. exposure are shown in FIG. 10. This data indicates that a substrate having an in-plane (x-y direction) CTE of about +6 to +7 ppm/°C., useful for LCCC applications, can be readily produced using relatively low magnetic fields (1 to 2 tesla).

The required magnetic fields can be readily attained using permanent magnets such as samarium cobalt and neodymium boron iron or standard electromagnets.

In yet another embodiment of the present invention, the molecular z-direction skewing of biaxially oriented articles, e.g., films, is achieved by the application of an electric field normal to the surface of the article. Samples of controlled biaxially oriented VECTRA® A900 film having a CTE of −2 to −4 ppm/°C. were exposed to electric fields. At DC voltages of approximately 300 volts, the −2 to −4 ppm/°C. CTE was altered to +7 to +8 ppm/°C. The details of these experiments are described below in Example 3.

The present invention has been described in detail including the preferred embodiments thereof. However, it will be appreciated that those skilled in the art, upon consideration of the present disclosure, may make modifications and/or improvements on this invention and still be within the scope and spirit of this invention as set forth in the following claims.

EXAMPLE 1

Production of Biaxial LCP Film

Figure 5:
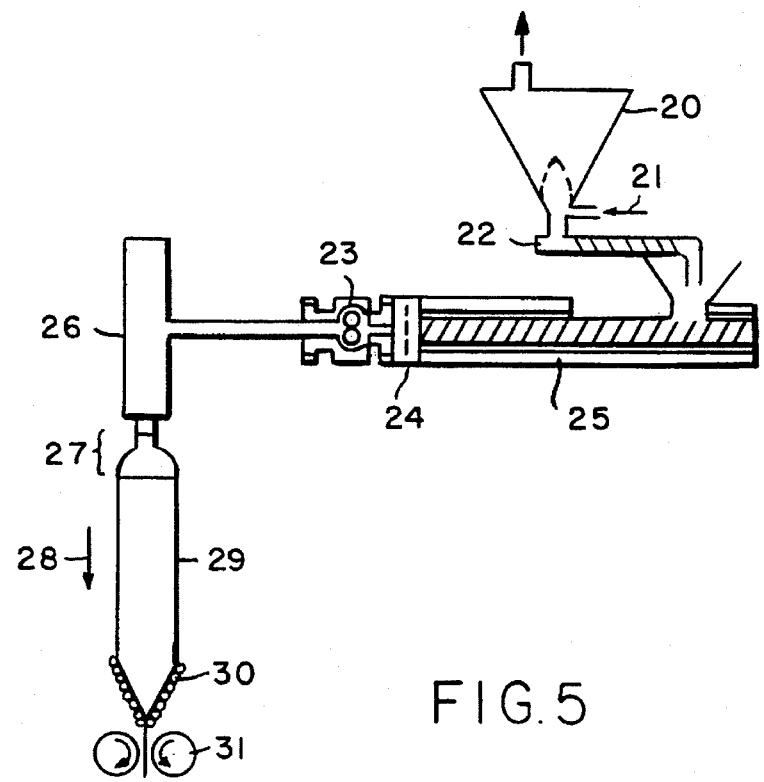
FIG. 5 is a schematic showing one process incorporating the counter-rotating die of FIG. 4.

Balanced biaxial (±45 degrees) VECTRA® A900 film was produced with Foster-Miller's counter-rotating die attached to a 1 in. Killion extruder, as seen in the schematic diagram in FIG. 5. A screw L/d of 24:1 and compression ratio of 6:1 was used. By adjusting the metering pump speed, die rotation speed, and take-up speeds, films of near uniaxial orientation to equal biaxial orientation have been obtained. Film of ±45 degrees orientation and 1 and 2 mils in thickness was produced using a processing temperature just above the melt endotherm temperature of 277° C.

For all our baseline measurements balanced two-ply laminates of [0,90 degrees] orientation (equivalent to LCP fibril orientations of [0,90,90,0 degrees]) were made. Lamination was accomplished using a 30 ton heated Tetrahedron press. VECTRA® A900 laminates were made by pressing together two film pieces 8 in$^2$ at 260° C., about 17° C. below its melting temperature. This lamination process eliminated the curling which was typically present in a single ply of film.

Relevant thermal and mechanical properties of VECTRA® A900 film were studied in some detail. The CTE of the baseline two-ply laminates was determined using a Perkin-Elmer model TMS-2 thermomechanical analyzer at a heating rate of 5° C./minute. Mechanical properties of films were determined using a United model FM-20 Universal Tensile Testing Machine.

Figure 6:
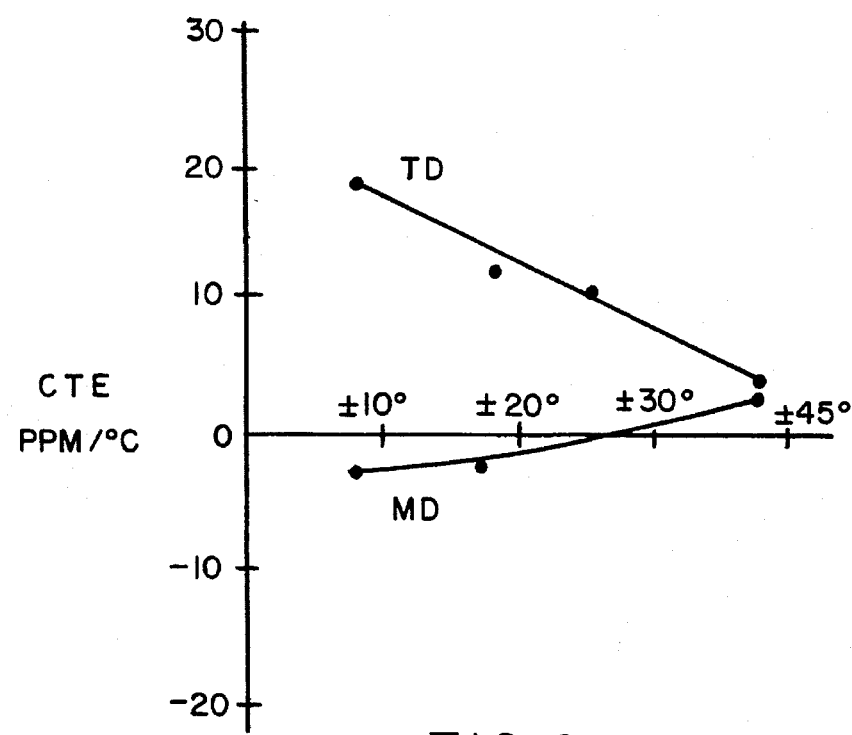
FIG. 6 is a graph which illustrates control of CTE through control of molecular orientation.

Mechanical properties of VECTRA® A900 films were determined as a function of orientation. Tensile strengths and moduli of ±10, ±20, ±30, and ±45 degree film were determined by testing rectangular specimens under ambient conditions according to ASTM D882. Results of typical tests can be seen in FIG. 6. The convergence of machine and transverse direction properties as orientation approaches ±45 degrees indicates a well-balanced film. Balanced film had a tensile strength of 25 Ksi and a modulus of about 1.3 Msi.

Two-ply laminates were used to determine in-plane CTE. Two types of laminates were made: one from two sheets of 1 mil ±45 degree film, and the other from two sheets of 2 mil ±45 degree film. Change in length was measured using an linear variable distance transducer (LVDT) over the range of −50° C. and 50° C. It was found that the laminate made from 1 mil film exhibited an in-plane CTE of −4 ppm/°C., and the laminate made from 2 mil film exhibited an in-plane CTE of −1 ppm/°C., with reasonable agreement between specimens cut from the same laminate. Although these numbers are slightly lower than numbers published in Hoechst-Celanese VECTRA® product literature, the difference is most likely due to the higher in-plane orientation resulting from the Extrusion Processes.

EXAMPLE 2

CTE Modification Using Magnetic Fields

Figure 11:
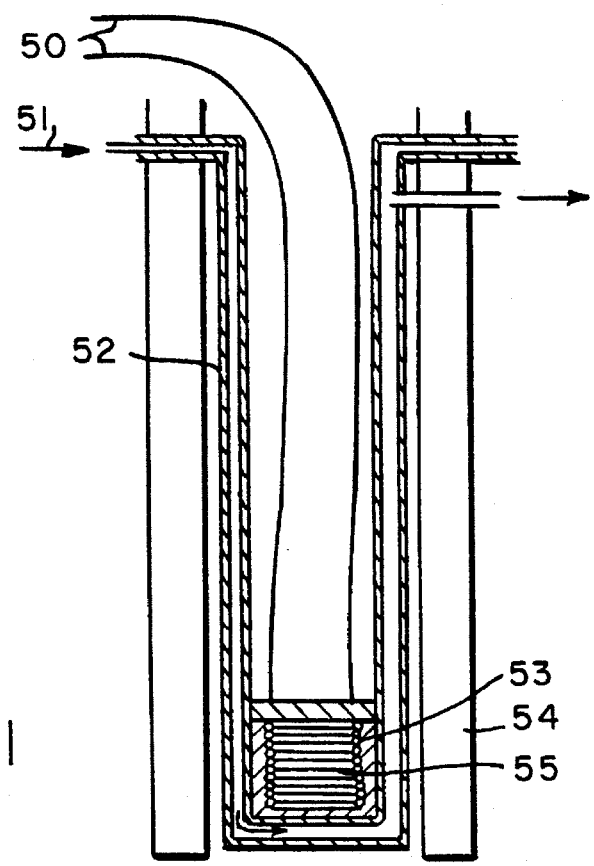
FIG. 11 is a diagram of a magnetic furnace and housing for use in accordance with the present invention.

To skew the LCP molecules out of the plane of a film obtained in accordance with Example 1 above, a 15 tesla superconducting magnet was used. A furnace was designed to use in conjunction with this magnet. FIG. 11 shows this design which includes a brass water jacket 52 to avoid overheating the magnet 54 and high-resistance, low-amperage, counter-wrapped heater wires to reduce coupling to the magnetic field. The furnace allowed for several ¾ in. discs of film to be processed simultaneously, separated by glass cover slips 55. The furnace (see heater wires 50 and heating elements 53) was constructed so that it could be placed within the bore of the superconducting magnet, with the field direction normal to the film's surface. The brass water-cooled (water inlet 51) jacket maintained ambient temperature outside the furnace. The furnace was tested for temperature uniformity and controllability, with excellent results in both categories. Specifically, the furnace was kept within 5 deg of 270° C. for 60 min, and thermocouple probes suspended near the top, middle and bottom of the furnace, as well as outside the furnace on the heater coils, agreed to within 2° C.

Using this furnace, a number of VECTRA® A900 LCP specimens obtained in accordance with Example 1 above, were subjected to a series of temperature/field exposures. All samples used were two-ply laminates of 2 mil ±45 degree film. The heating element was placed inside the brass cooling jacket within the bore of the magnet, and the field brought up at approximately 0.75 tesla/min. When the field stabilized, the heating chamber was activated to raise the temperature of the samples in field. After the appropriate time interval for each particular condition, the heating element was deactivated, allowing the sample to cool in field. The field was then ramped down to zero, and the samples removed from the furnace.

Table 1 below, reports the effects of magnetic field exposure and sample temperature on the CTE of VECTRA® A900 films having a controlled in-plane biaxial orientation. Temperatures were varied from just below the crystalline melt temperature, 270° C., to above the crystalline melt temperature, 290° C. Field strengths varied from 0 to 13 tesla, and times of exposure ranged from 2 to 45 min. As can be seen in the table, significant changes in CTE were achieved through the magnetic reorientation at 290° C. From a baseline CTE of −1 ppm/°C., the process raised the CTE to as high as 64 ppm/°C.

TABLE 2

Effect of Magnetic Field Exposure on the CTE of biaxially oriented VECTRA ® A900 LCP film having a controlled in-plane biaxial orientation.

| Sample Temperature °C. | Time of Exposure (min) | Magnetic Field | CTE (ppm/°C.) |
| --- | --- | --- | --- |
| 270 | 15 | 0 | −4 |
| 270 | 60 | 0 | −2 |
| 290 | 15 | 0 | −3 |
| 270 | 15 | 5 | −10 |
| 270 | 45 | 5 | −1 |
| 270 | 45 | 13 | −1 |
| 290 | 15 | 13 | 64 |
| 290 | 15 | 5 | 20 |
| 290 | 15 | 2 | 22 |

Although exposure to the field at 270° C. had some effect, when the films were exposed to the magnetic field at 290° C., the effect was dramatic, as shown in FIG. 10. The in-plane CTE increased from −1 to −4 ppm/°C. without the field to nearly 65 ppm/°C. in a 13 tesla field. These data indicate that the desired substrate CTE for use with LCCCs (+6 to +7 ppm/°C.) can be readily attained using relatively low magnetic fields (1 to 2 tesla).

EXAMPLE 3

CTE Modification Using Electric Fields

The shifting of main chain LCP molecules during exposure to an electric field can be monitored by measuring the electric susceptibility of films. This electrical susceptibility can be determined by measuring the capacitance of the LCP substrate. For a parallel plate capacitor, the geometry used for making electrical measurements, the capacitance C is given by:

$$C = (\epsilon A)/d$$

where C is the capacitance, A is the area of the conducting plates, d is the distance separating the plates (film thickness) and $\epsilon$ is the permittivity of the film. The permittivity is related to the dielectric constant K of the material: $K = \epsilon/\epsilon_O$, where $\epsilon_O$ is the permittivity of free space. The electric susceptibility, $E_S$, is defined as $E_S = \epsilon - \epsilon_O = \epsilon_O(K-1)$.

Figure 12:
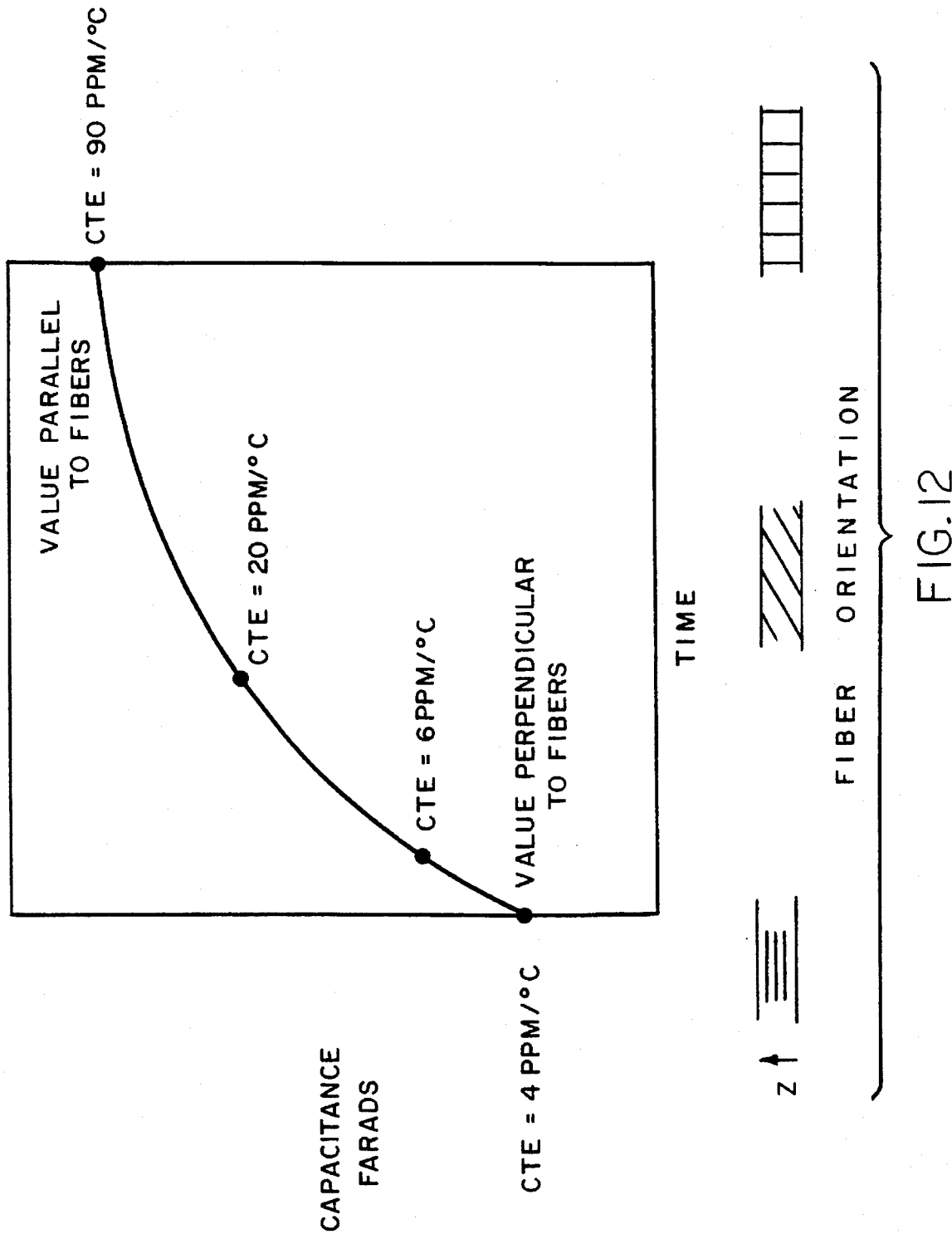
FIG. 12 shows change in capacitance and CTE in response to exposure to a DC field over varying time.

By using an inductance/capacitance/resistance (LCR) meter, the LCP's response to varying electric fields and temperatures can be measured as a function of time of exposure. Typical results expected are shown in FIG. 12. This on-line technique enables the determination of when the LCP substrate has achieved the appropriate molecular orientation to provide the desired CTE.

Figure 13:
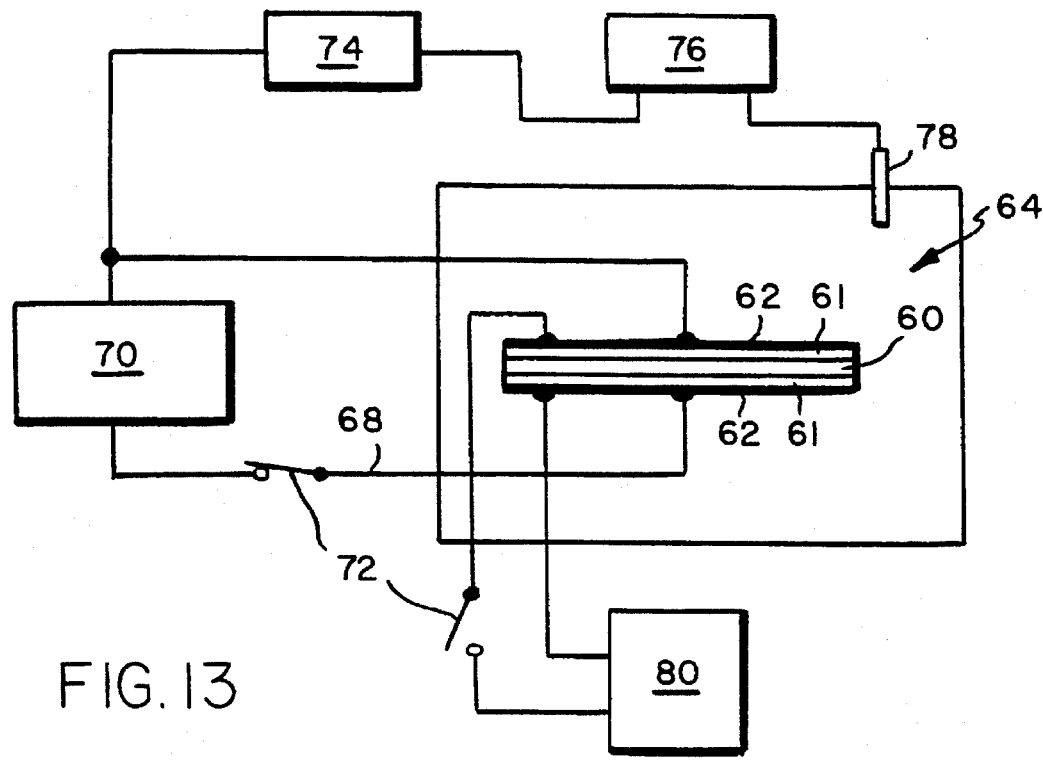
FIG. 13 is a schematic illustration of an apparatus used to tailor the CTE by the application of an electric field in accordance with the present invention.

The in-plane CTE of balanced biaxial VECTRA® A900 film was tailored from −1 to −4 ppm/°C. to +7 to +8 ppm/°C. using a DC field of approximately 300 volts. The apparatus used to perform this experiment is illustrated in FIG. 13. Two pieces of a high temperature release film (Upilex) 61 was sputter coated with gold 62 to a thickness of 50 nanometers using a Baizers Union SCD 004 Sputter Coater. The balanced biaxial VECTRA® A900 LCP film was sandwiched between the sputter coated film with the gold coating facing outwards. This laminated structure was placed in an oven 64, and the positive 66 and negative 68 leads from a DC voltage source 70 were attached in the two gold coated surfaces 62. A dual circuit opposing switch is shown at 72; a thousand/one voltage reduction is shown at 74, a dual channel recorder is shown at 76; a thermal couple is shown at 78; and an LCR meter is shown at 80. When the oven reached the desired temperature 500° F. a DC voltage was applied to the film for about 15 minutes. The LCP film was separated from the gold coated release film and tested for in-plane CTE which was determined to be about +7 to +8 ppm/°C.

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. A method of tailoring the CTE of a thermotropic or lyotropic liquid crystalline polymer film-based or tubular component having a controlled in-plane biaxial orientation, the method comprising treating a film or tube comprising the thermotropic or lyotropic liquid crystalline polymer with an electric or a magnetic field that is normal to the in-plane orientation while the film or tube is at a temperature which allows reorientation of the thermotropic liquid crystalline polymer molecules by the field or before a level of coagulation is reached which prevents molecular reorientation of the lyotropic liquid crystalline polymer thereby skewing the controlled biaxial orientation out of the plane of biaxial orientation to obtain a film or tube with a desired CTE and then solidifying the aromatic thermotropic liquid crystalline polymer or coagulating the lyotropic liquid crystalline polymer to fix the desired CTE in the film or tube.

2. The method in accordance with claim 1 wherein the controlled biaxial orientation is skewed to about 2 to 88 degrees of normal to the plane of biaxial orientation.

3. A method of preparing a film-based or tubular component having a controlled CTE and comprising an aromatic thermotropic or lyotropic liquid crystalline polymer film or tube having a controlled in-plane biaxial orientation skewed out of the plane of orientation, the method comprising the steps of:

(a) simultaneously treating a melt comprising the aromatic thermotropic liquid crystalline polymer or a dope comprising the lyotropic liquid crystalline polymer with (i) simultaneous biaxial shearing forces and (ii) an electric or magnetic field that is normal to each of the biaxial shearing forces, thereby producing a film or tube having at least three microscale structural orientations, wherein the strength and duration of the field is selected so as to skew a controlled amount of in-plane biaxial orientation out of the plane of orientation; and (b) treating the film or tube obtained in step (a) with cross-directional strains comprising transverse and longitudinal extensions thereby imparting additional microscale structural organization to the film or tube, whereby a desired CTE is obtained by the steps of (a) and (b);

(c) after the desired CTE has been achieved, solidifying the aromatic thermotropic liquid crystalline polymer or coagulating the lyotropic liquid crystalline polymer to fix the desired CTE in the film or tube.

4. A method in accordance with claim 3, wherein the controlled in-plane biaxial orientation is skewed to about 2 to 88 degrees of normal to the plane of biaxial orientation.

5. A method of preparing a film-based or tubular component having a controlled CTE and comprising an aromatic thermotropic or lyotropic liquid crystalline polymer film or tube having a controlled in-plane biaxial orientation skewed out of the plane of orientation, the method comprising the sequential steps of:

(a) treating a melt comprising the aromatic thermotropic liquid crystalline polymer or a dope comprising the lyotropic liquid crystalline polymer with simultaneous biaxial shearing forces, thereby producing a film or tube having a controlled in-place biaxial orientation;

(b) treating the film or tube obtained in step (a) with cross-directional strains comprising transverse and longitudinal extensions thereby imparting additional controlled in-plane orientation; and (c) subjecting the film or tube obtained in step (b) to an electric or a magnetic field that is normal to the in-plane orientation while the film or tube is at a temperature which allows reorientation of the thermotropic liquid crystalline polymer molecules by the field or before a level of coagulation is reached which prevents molecular reorientation of the lyotropic liquid crystalline polymer and controlling the field to skew a predetermined amount of in-plane biaxial orientation out of the plane of orientation to obtain a film or tube with a desired CTE;

(d) after the desired CTE has been achieved, solidifying the aromatic thermotropic liquid crystalline polymer or coagulating the lyotropic liquid crystalline polymer to fix the desired CTE in the film or tube.

6. A method in accordance with claim 5, wherein the controlled biaxial orientation is skewed to about 2 to 88 degrees of normal to the plane of biaxial orientation.

7. A method in accordance with claim 5, wherein the liquid crystalline polymer is lyotropic and the method further comprises a step between steps (b) and (c) wherein the film or tube is partially coagulated.

8. A method in accordance with claim 3, wherein the in-plane CTE is about 2 to 17 ppm/°C.

* * * * *